(12) United States Patent
Yung et al.

(10) Patent No.: US 11,287,472 B2
(45) Date of Patent: Mar. 29, 2022

(54) CHIP AND TESTING METHOD THEREOF

(71) Applicant: Realtek Semiconductor Corporation, Hsinchu (TW)

(72) Inventors: Sheng-Ping Yung, Taoyuan (TW); Pei-Ying Hsueh, Hsinchu (TW); Chun-Yi Kuo, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/028,021

(22) Filed: Sep. 22, 2020

(65) Prior Publication Data

US 2021/0096180 A1 Apr. 1, 2021

(30) Foreign Application Priority Data

Sep. 27, 2019 (TW) .................................. 108135309

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31712* (2013.01); *G01R 31/318563* (2013.01); *G01R 31/318566* (2013.01)

(58) Field of Classification Search
CPC ........ G01R 31/3177; G01R 31/318563; G01R 31/318566; G01R 31/31712
See application file for complete search history.

(56) References Cited

U.S. PATENT DOCUMENTS

| 7,979,763 | B2 | 7/2011 | Wohl et al. | |
|---|---|---|---|---|
| 2012/0233511 | A1* | 9/2012 | Kim ............... | G01R 31/318547 714/726 |
| 2014/0032986 | A1* | 1/2014 | Wan ....................... | G11C 29/40 714/727 |

FOREIGN PATENT DOCUMENTS

| TW | 201017193 A | 5/2010 |
|---|---|---|
| TW | 201742448 A | 12/2017 |
| TW | 201905482 A | 2/2019 |

* cited by examiner

*Primary Examiner* — Cynthia Britt
(74) *Attorney, Agent, or Firm* — Locke Lord LLP; Tim Tingkang Xia, Esq.

(57) ABSTRACT

A chip testing method including the following operations is disclosed: outputting a plurality of testing sequences to a plurality of scan chains by an encoding circuit; generating a plurality of scan output data according to the plurality of testing sequences by the plurality of scan chains; and determining whether an error exists in the plurality of scan chains or not according to the plurality of scan output data by a decoding circuit.

20 Claims, 7 Drawing Sheets

CHIP AND TESTING METHOD THEREOF

CROSS-REFERENCE TO RELATED APPLICATION

This application claims the priority benefit of TAIWAN Application serial no. 108135309, filed Sep. 27, 2019, the full disclosure of which is incorporated herein by reference.

FIELD OF INVENTION

The invention relates to a chip and a testing method thereof. More particularly, the invention relates to a chip and a testing method thereof for scan chain testing.

BACKGROUND

The conventional chip testing method is to switch the chip to a scan mode by inputting control signals from an automatic testing machine, and then use the scan testing sequence with high error coverage rate for testing and diagnosis, so as to find and provide the location of the error failure in the chip to the engineers for analyzing. However, such a testing process requires an expensive automatic testing machine to perform the test, and when the integrated circuit chip fails, it is hard to identify the reason is that the digital logic inside the chip is defective or that the scan mode for testing cannot be successfully entered.

SUMMARY

An aspect of this disclosure is to provide a chip testing method including the following operations: outputting a plurality of testing sequences to a plurality of scan chains by an encoding circuit; generating a plurality of scan output data according to the plurality of testing sequences by the plurality of scan chains; and determining whether an error exists in the plurality of scan chains or not according to the plurality of scan output data by a decoding circuit.

Another aspect of this disclosure is to provide a chip. The chip includes a plurality of scan chains, an encoding circuit, and a decoding circuit. The encoding circuit is configured to output a plurality of testing sequences to the plurality of scan chains. The decoding circuit is configured to receive a plurality of scan output data by the plurality of scan chains, and to determine whether an error exists in the plurality of scan chains or not according to the plurality of scan output data, in which the plurality of scan output data is generated by the plurality of scan chains according to the plurality of testing sequences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of elements and arrangements are described lower than to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed lower than, or elsewhere in the specification, to provide additional guidance to the practitioner regarding the description of the invention.

Figure 1:
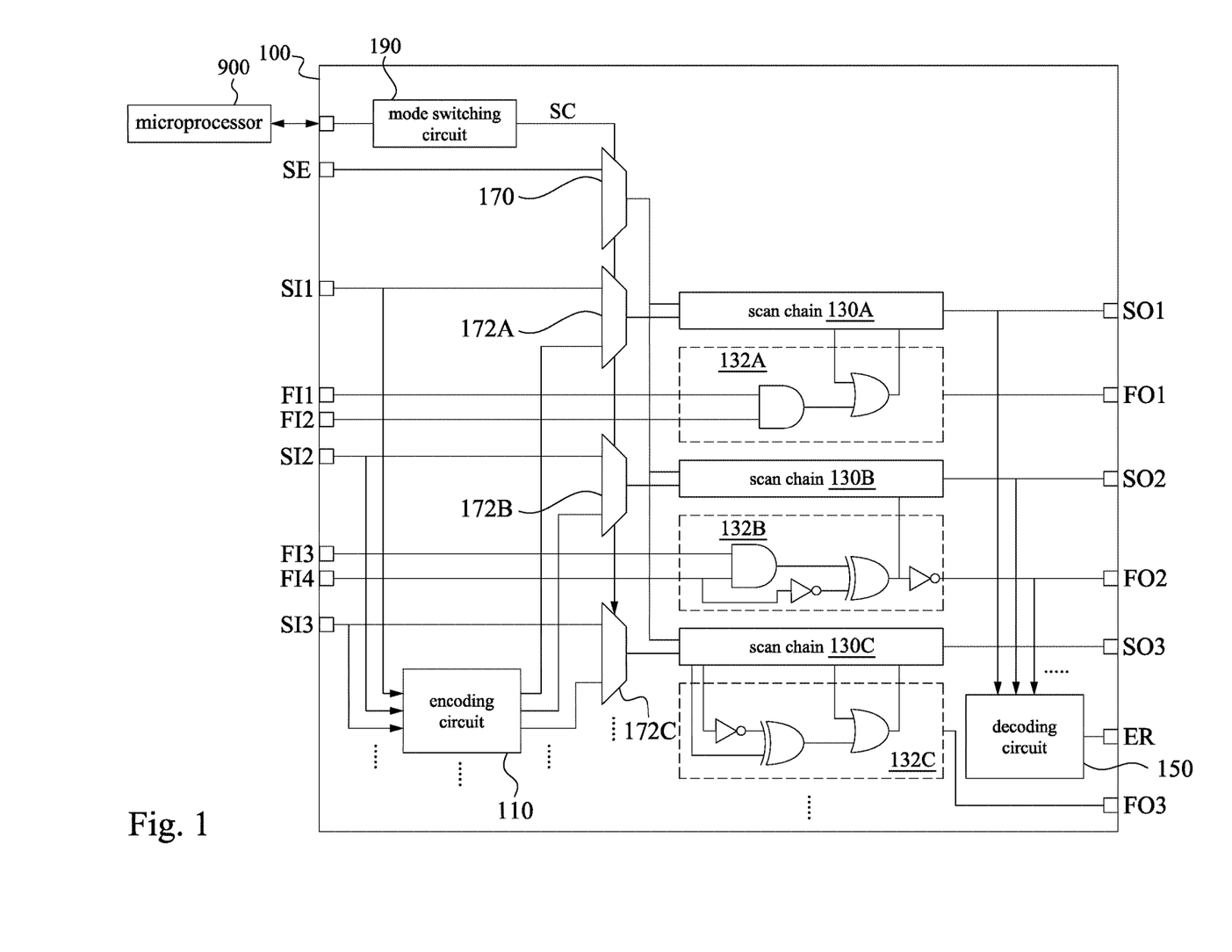
FIG. 1 is a schematic diagram illustrating a chip according to some embodiments of the present disclosure.

FIG. 1 is a schematic diagram illustrating a chip 100 according to some embodiments of the present disclosure. The chip 100 includes several scan chains 130A to 130C, the encoding circuit 110, and the decoding circuit 150. In the connection relationship, several scan chains 130A to 130C are coupled to the encoding circuit 110 and the decoding circuit 150. The chip 100 is coupled to a microprocessor 900, so as to switch the chip 100 to operate in the function mode or the scan chain testing mode according to a message transmitted by the microprocessor 900. The chip 100 illustrated in FIG. 1 is for illustrative purposes only, and the embodiments of the present disclosure are not limited thereto.

In some embodiments, the chip 100 further includes a mode switching circuit 190, several multiplexers 172A to 172C, and a multiplexer 170. The mode switching circuit 190 is configured to transmit a control signal SC to the multiplexer 170 and the multiplexers 172A to 172C according to the message transmitted to the microprocessor 900. In the connection relationship, the control terminals of the multiplexers 172A to 172C are coupled to the mode switching circuit 190, one of the input terminals of the multiplexers 172A to 172C is configured to receive scan input data SI1 to SI3, another input terminals of the multiplexers 172A to 172C are coupled to the encoding circuit 110, and the output terminals of the multiplexers 172A to 172C are coupled to the scan chains 130A to 130C. Furthermore, the control terminal of the multiplexer 170 is coupled to the mode switching circuit 190, one of the input terminal of the multiplexer 170 is configured to receive an enabling signal SE, and the output terminal of the multiplexer 170 is coupled to the scan chains 130A to 130C.

As illustrated in FIG. 1, the chip 100 includes several functional logic circuits 132A to 132C. The functional logic circuits 132A to 132C respectively corresponds to one of the scan chains 130A to 130C. One ends of the functional logic circuits 132A to 132C are configured to receive function input data FI1 to FI4, and another end of the functional logic circuits 132A to 132C are configured to output function output data FO1 to FO3.

Figure 2:
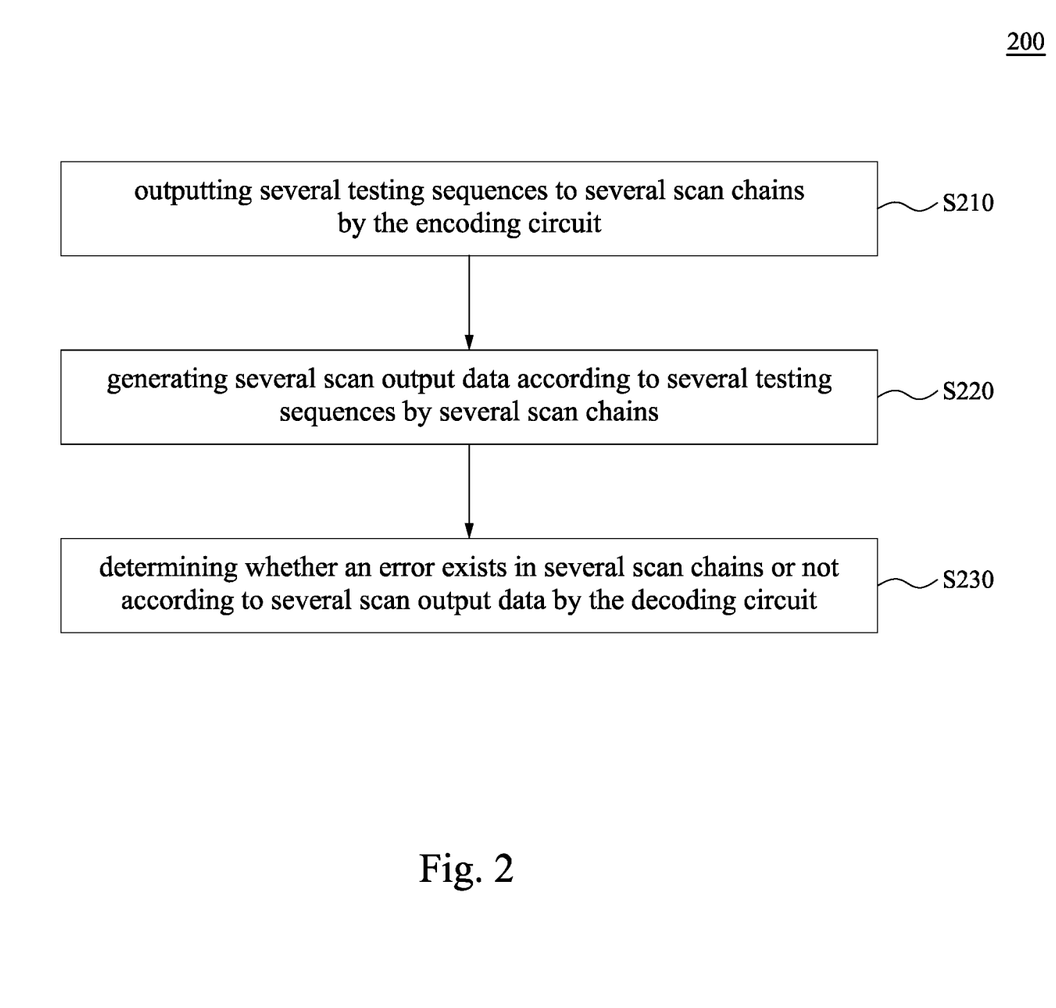
FIG. 2 is a flow chart illustrating a testing method according to some embodiments of the present disclosure.

The details of the embodiments of the present disclosure are disclosed below with reference to FIG. 2, where FIG. 2 is a flowchart of a testing method 200 applicable to the chip 100 in FIG. 1. FIG. 2 is a flow chart illustrating a testing method 200 according to some embodiments of the present disclosure. However, the embodiments of the present disclosure are not limited thereto. The testing method 200 includes operations S210 to S230. In order to make the testing method 200 of this embodiment easy to understand, reference is made to FIG. 1 together.

Operation S210: outputting several testing sequences to several scan chains by the encoding circuit. Reference is made to FIG. 1 together. In some embodiments, the encoding circuit 110 outputs several testing sequences to several scan chains. In details, in some embodiments, the encoding circuit 110 receives several scan input data SI1 to SI3, and the encoding circuit 110 generates several testing sequences according to several scan input data SI1 to SI3 and at least one examination datum.

Figure 3:
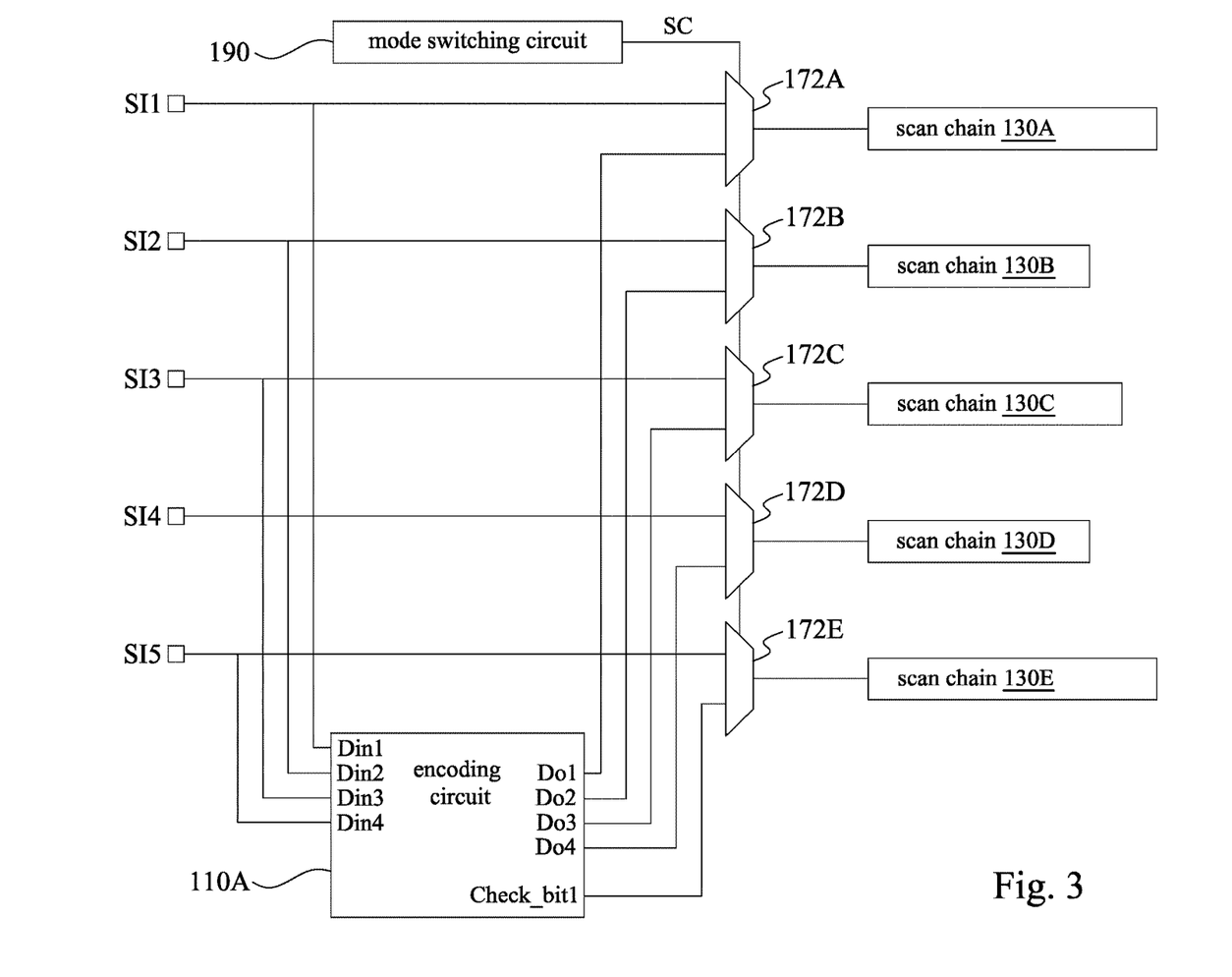
FIG. 3 is a schematic diagram illustrating an encoding circuit according to some embodiments of the present disclosure.

For one of the embodiments of operation S210, reference is made to FIG. 3 together. FIG. 3 is a schematic diagram illustrating an encoding circuit 110A according to some embodiments of the present disclosure. The encoding circuit 110A is a parity check encoding circuit, including input bits Din1 to Din4, output bits Do1 to Do4, and check bit Check_bit1. As illustrated in FIG. 3, the encoding circuit 110A receives the scan input data SI1 to SI4 so as to composite input bits Din1 to Din4, and the encoding circuit 110A generates the testing sequences according to the scan input data SI1 to SI4 and the examination datum, wherein the testing sequences include output bits Do1 to Do4 and the check bit Check_bit1. The encoding circuit 110A further transmits the output bits Da1 to Do4 and the check bit Check_bit1 to the scan chains 130A to 130E.

Figure 4:
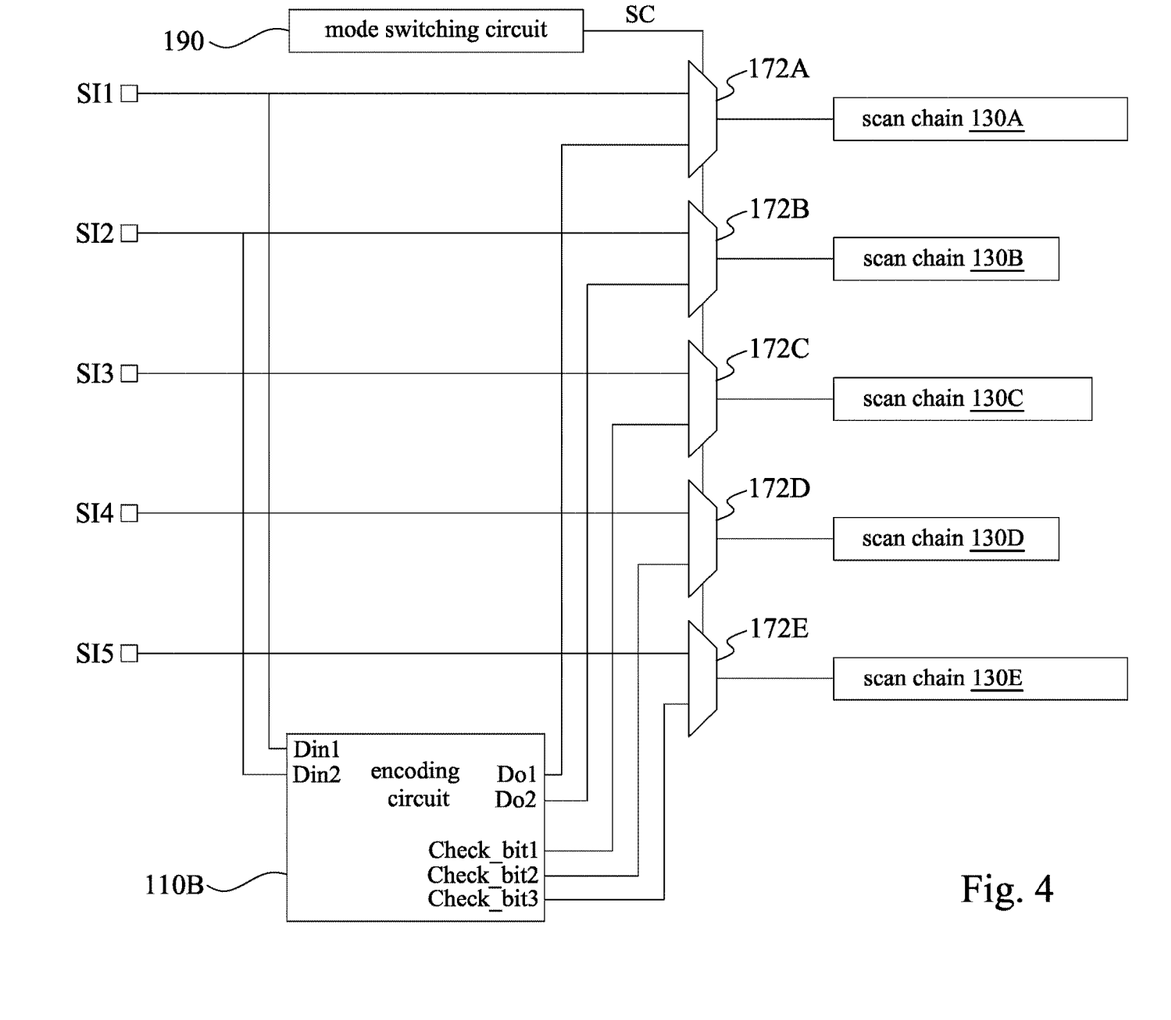
FIG. 4 is a schematic diagram illustrating another encoding circuit according to some embodiments of the present disclosure.

For another embodiment of the operation S210, reference is made to FIG. 4 together. FIG. 4 is a schematic diagram illustrating another encoding circuit 110B according to some embodiments of the present disclosure. The encoding circuit 110B is a Hamming code encoding circuit, including the input bits Din1 to Din2 and the output bits Do1 to Do2 and the check bits Check_bit1 to Check_bit3. As illustrated in FIG. 4, the encoding circuit 110B receives the scan input data SI1 to SI2 so as to composite the input bits Din1 to Din2, and the encoding circuit 110B generates the testing sequences according to the scan input data SI1 to SI2 and the examination datum, wherein the testing sequences include the output bits Do1 to Do2 and the check bits Check_bit1 to Check_bit3. The encoding circuit 110B further transmits the output bits Do1 to Do2, the check bits Check_bit1 to Check_bit3 the scan chains 130A to 130E.

In some embodiments, in operation S210, the encoding circuit 110 transmits the testing sequence to the multiplexers 172A to 172E, and then during the scan chain testing mode, the multiplexers 172A to 172E transmit the testing sequences to the scan chains 130A to 130E. In some embodiments, the multiplexers 172A to 172E switches to the scan chain testing mode according to the control signal SC transmitted by the mode switching circuit 190.

Operation S220: generating several scan output data according to several testing sequences by several scan chains. Reference is made to FIG. 1 together, after the scan chains 130A to 130C receive the testing sequences, and the scan chains 130A to 130C generates the scan output data SO1 to SO3, and the scan chains 130A to 130C transmit the scan output data SO1 to SO3 to the decoding circuit 150. In some embodiments, in operation S220, the multiplexer 170 generate the enabling signal SE to the scan chains 130A to 130C according to the control signal SC transmitted by the mode switching circuit 190, so that the scan chains 130A to 130C are operated under scan chain testing mode.

Operation S230: determining whether an error exists in several scan chains or not according to several scan output data by the decoding circuit. Reference is made to FIG. 1 at the same time. The decoding circuit 150 determines whether the scan chains 130A to 130C exist an error according to the scan output data SO1 to SO3.

Figure 5:
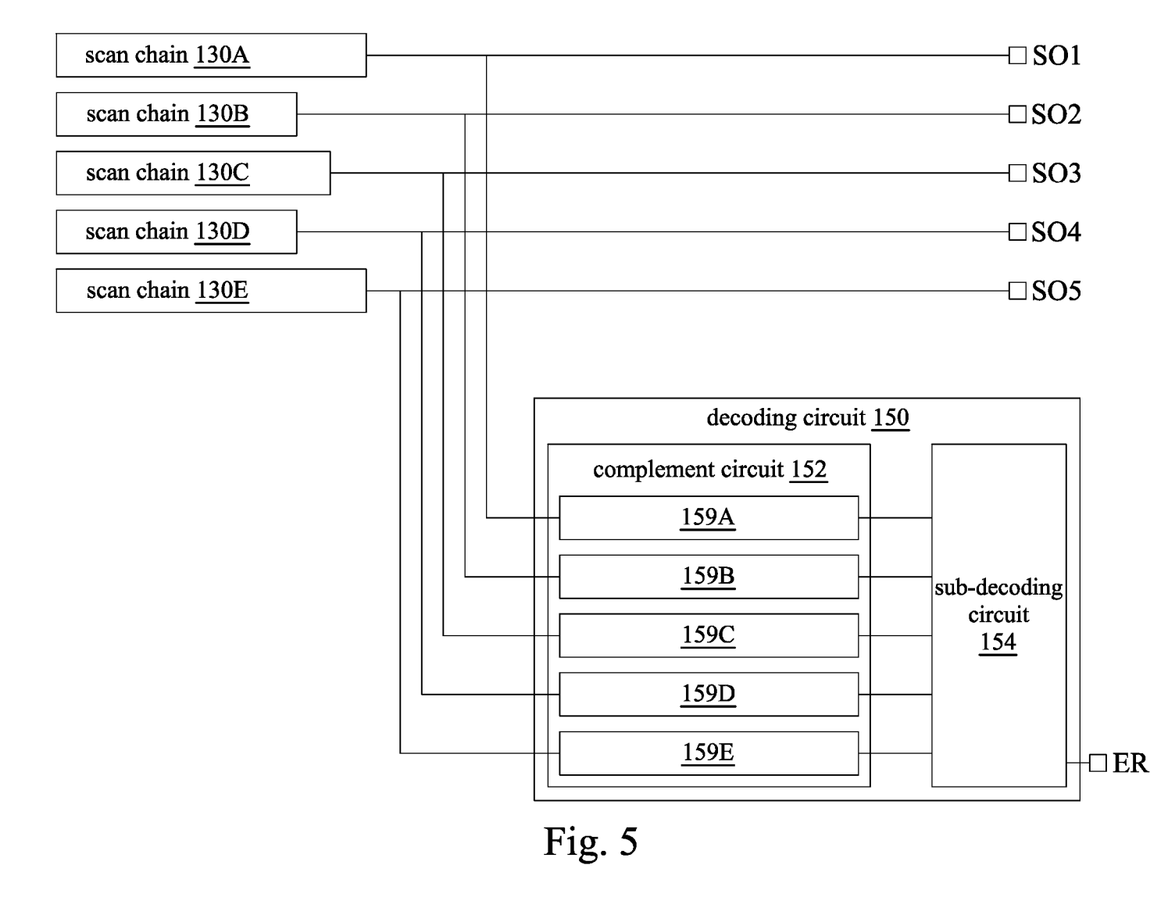
FIG. 5 is a schematic diagram illustrating a decoding circuit according to some embodiments of the present disclosure.

Reference is made to FIG. 5 together. FIG. 5 is a schematic diagram illustrating a decoding circuit 150 according to some embodiments of the present disclosure. In some embodiments, the decoding circuit 150 includes complement circuit 152 and the sub-decoding circuit 154. In operation S230, the scan chains 130A to 130E transmit scan output data SO1 to SO5 to the complement circuit 152. The complement circuit 152 operates a complement process to the scan output data SO1 to SO5 to generate post complement data with the same length, and the complement circuit 152 transmits post complement data to the sub-decoding circuit 154.

In details, when the lengths of the scan chains 130A to 130E are different, the lengths of the scan output data SO1 to SO5 generated by the scan chains 130A to 130E are different. If the maximum length of the scan output data SO1 to SO5 is $L_{max}$, the complement circuit 152 operates complement process to the scan output data SO1 to SO5 so that the lengths of the scan output data SO1 to SO5 are the maximum length $L_{max}$. The complement circuit 152 integrates shift registers of different lengths so as to achieve the scan chain complement function. For example, in the embodiment, the lengths of the scan chains 130A to 130E are L1, L2, L3, L4, and L5 respectively, and the maximum length of scan chains 130A to 130E is defined as $L_{max}$. In order to make the scan chain output data SO and the check bit Check_bit reach the sub-decoding circuit 154 at the same clock, the complement circuit 152 adds shift registers with lengths of ($L_{max}$-L1), ($L_{max}$-L2), ($L_{max}$-L3), ($L_{max}$-L4), and ($L_{max}$-L5) at the output ends of the scan chains, so as to achieve the scan chain complement function. After operating the complement process, the complement circuit 152 generates the post complement data, and the complement circuit 152 transmits the post complement data to the sub-decoding circuit 154. In some embodiments, the sub-decoding circuit 154 generates the determination datum ER according to the post complement data. The determination datum ER is configured to indicate whether an error exists in the scan chains 130A to 130E or not.

In some embodiments, as illustrated in FIG. 5, the complement circuit 152 includes the sub-complement circuits 159A to 159E. The sub-complement circuits 159A to 159E respectively couples to one of the scan chains 130A to 130E, so as to operate complement process to the output data transmitted by one of the scan chains 130A to 130E.

Figure 6:
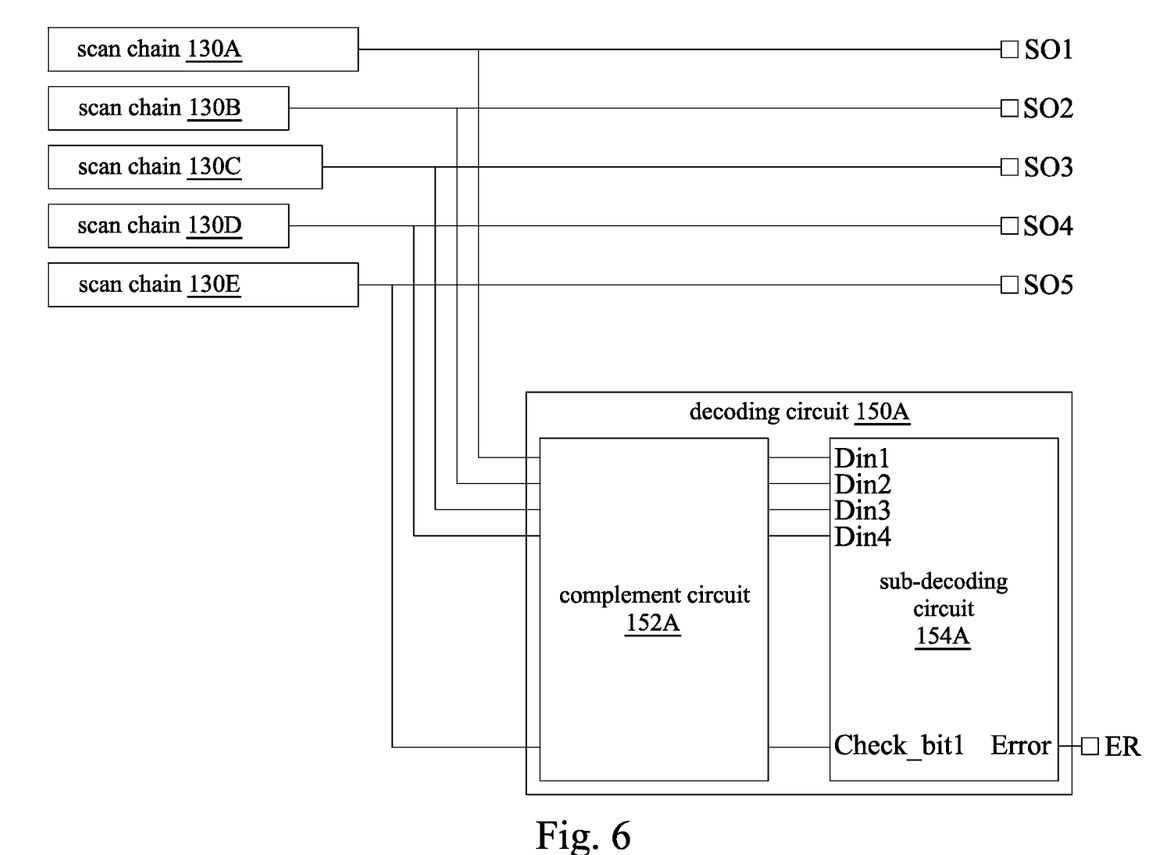
FIG. 6 is a schematic diagram illustrating a decoding circuit according to some embodiments of the present disclosure.

For one of the embodiments of the operation S230, reference is made to FIG. 6 together. FIG. 6 is a schematic diagram illustrating a decoding circuit 150A according to some embodiments of the present disclosure. The sub-decoding circuit 154A is a parity check decoding circuit, and the sub-decoding circuit 154A includes the input bits Din1 to Din4 and the check bit Check_bit1. The sub-decoding circuit 154A determines whether the scan chains 130A to 130E include an error according to the input bits Din1 to Din4 and the check bit Check_bit1, and the sub-decoding circuit 154A outputs the determination result by the output bit Error.

Figure 7:
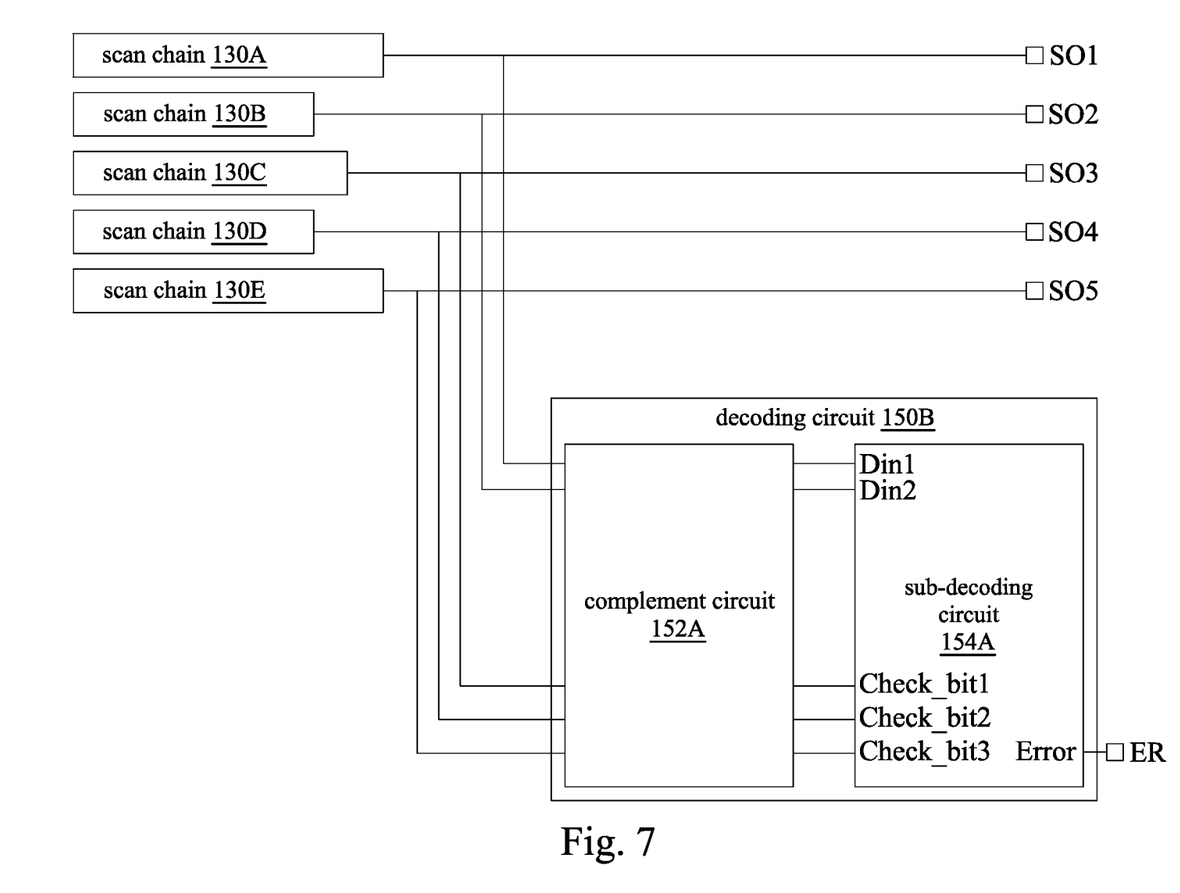
FIG. 7 is a schematic diagram illustrating another decoding circuit according to some embodiments of the present disclosure.

For another embodiment of the operation S230, reference is made to FIG. 7 together. FIG. 7 is a schematic diagram illustrating another decoding circuit 150B according to some embodiments of the present disclosure. The sub-decoding circuit 154B is a Hamming code decoding circuit, and the sub-decoding circuit 154B includes the input bits Din1 to Din2 and the check bits Check_bit1 to Check_bit3. The sub-decoding circuit 154B determines whether the scan chains 130A to 130E includes an error or not according to the input bits Din1 to Din2 and the check bits Check_bit1 to Check_bit3, and the sub-decoding circuit 154B outputs the determination result by the output bit Error.

In some embodiments, the decoding circuit 150 corresponds to the encoding circuit 110. That is, when the encoding circuit 110 is a parity check encoding circuit, the decoding circuit 150 is a parity check decoding circuit. When the encoding circuit 110 is a Hamming code encoding circuit, the decoding circuit 150 is a Hamming code decoding circuit. Furthermore, the decoding circuits and the encoding circuits mentioning above are for illustrative purposes only, other types of decoding and encoding circuits, such as low-density parity-check (LDPC code), BCH correction code, and cyclic redundancy check code, are also within the embodiments of the present disclosure.

Furthermore, the lengths of the scan chains 130A to 130E, the numbers of the scan chains 130A to 130E, and the numbers of the multiplexers 172A to 172E illustrated are for illustrative purposes only, and the embodiments of the present disclosure are not limited thereto.

According to embodiments of the present disclosure, it is understood that the embodiments of the present disclosure provide a chip and a testing method thereof, by integrating the scan chain error detection circuit in the integrated circuit chip, that is, the encoding circuit and the decoding circuit are integrated in the chip, the engineer can directly perform the scan chain test on the chip side, thereby accelerating and quickly clarifying whether the failure of the test sequence is caused by unable to enter the scan mode, and the test cost of automatic test machine debugging is reduce.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip testing method, comprising:
   outputting a plurality of testing sequences to a plurality of scan chains by an encoding circuit;
   generating a plurality of scan output data according to the plurality of testing sequences by the plurality of scan chains; and
   determining whether an error exists in the plurality of scan chains or not according to the plurality of scan output data by a decoding circuit.

2. The chip testing method of claim 1, further comprising:
   transmitting the plurality of testing sequences to the plurality of scan chains during a scan chain testing mode by a plurality of multiplexer.

3. The chip testing method of claim 2, further comprising:
   outputting a control signal to the plurality of multiplexers by a mode switching circuit, so as to switch the plurality of multiplexers to the scan chain testing mode.

4. The chip testing method of claim 1, further comprising:
   outputting an enabling signal to the plurality of scan chains according to a control signal by a multiplexer, so as to make the plurality of scan chains operate in a scan chain testing mode.

5. The chip testing method of claim 4, further comprising:
   outputting the control signal to the multiplexer by a mode switching circuit.

6. The chip testing method of claim 1, further comprising:
   operating a complement process to the plurality of scan output data by a complement circuit, so as to generate a plurality of post complement data with the same length.

7. The chip testing method of claim 6, further comprising:
   generating a determination datum according to the plurality of post complement data by the decoding circuit, wherein the determination datum indicates whether the error exists in the plurality of scan chains or not.

8. The chip testing method of claim 6, wherein the plurality of scan output data comprise a maximum length of data, wherein the chip testing method further comprises:
   operating the complement process by the complement circuit so that a plurality of lengths of the plurality of scan output data are the same as the maximum length of data.

9. The chip testing method of claim 1, further comprising:
   receiving a plurality of scan input data by the encoding circuit; and
   generating the plurality of testing sequences according to the plurality of scan input data.

10. The chip testing method of claim 1, further comprising:
    generating a determination datum according to the plurality of scan output data by the decoding circuit, wherein the determination datum is configured to indicate whether the plurality of scan chains comprise an error.

11. A chip, comprising:
    a plurality of scan chains;
    an encoding circuit, configured to output a plurality of testing sequences to the plurality of scan chains; and
    a decoding circuit, configured to receive a plurality of scan output data by the plurality of scan chains, and to determine whether an error exists in the plurality of scan chains or not according to the plurality of scan output data, wherein the plurality of scan output data are generated by the plurality of scan chains according to the plurality of testing sequences.

12. The chip of claim 11, further comprising:
a plurality of multiplexers, coupled to the encoding circuit and the plurality of scan chains, configured to switch to a scan chain testing mode according to a control signal, and to transmit the plurality of testing sequences to the plurality of scan chains when switching to the scan chain testing mode.

13. The chip of claim 12, further comprising:
a mode switching circuit, configured to output the control signal to the plurality of multiplexers.

14. The chip of claim 11, further comprising:
a multiplexer, configured to output an enabling signal to the plurality of scan chains according to a control signal, so as to operate the plurality of scan chains in a scan chain testing mode.

15. The chip of claim 14, further comprising:
a mode switching circuit, configured to output the control signal to the multiplexer.

16. The chip of claim 11, wherein the decoding circuit comprises:
a complement circuit, configured to operate a complement process to the plurality of scan output data, so as to generate a plurality of post complement data with the same length.

17. The chip of claim 16, wherein the decoding circuit is further configured to generate a determination datum according to the plurality of post complement data, wherein the determination datum is configured to indicate whether the error exists in the plurality of scan chains or not.

18. The chip of claim 16, wherein the plurality of scan output data comprise a maximum length of data, wherein the complement circuit is further configured to make a plurality of lengths of the plurality of scan output data are equal to the maximum length of data.

19. The chip of claim 11, wherein the encoding circuit is further configured to receive a plurality of scan input data, and to generate the plurality of testing sequences according to the plurality of scan input data.

20. The chip of claim 11, wherein the decoding circuit is further configured to generate a determination datum according to the plurality of scan output data, wherein the determination datum is configured to indicate whether the plurality of scan chains comprise an error or not.

* * * * *